United States Patent [19]

Besen et al.

[11] Patent Number: 5,688,382

[45] Date of Patent: Nov. 18, 1997

[54] MICROWAVE PLASMA DEPOSITION SOURCE AND METHOD OF FILLING HIGH ASPECT-RATIO FEATURES ON A SUBSTRATE

[75] Inventors: Matthew M. Besen, Tewksbury; Lawrence Bourget, Reading; William M. Holber, Cambridge; Donald K. Smith, Belmont; Richard S. Post, Lexington, all of Mass.

[73] Assignee: Applied Science and Technology, Inc., Woburn, Mass.

[21] Appl. No.: 521,958

[22] Filed: Aug. 31, 1995

Related U.S. Application Data

[63] Continuation of Ser. No. 204,069, Mar. 1, 1994, abandoned.

[51] Int. Cl.[6] ................................................ C23C 14/34
[52] U.S. Cl. ........................ 204/192.12; 204/298.06; 204/298.11; 204/298.16; 204/298.12
[58] Field of Search ................. 204/298.07, 298.06, 204/298.14, 298.16, 298.19, 298.11, 298.38, 298.12, 192.12

[56] References Cited

U.S. PATENT DOCUMENTS

| | | | |
|---|---|---|---|
| 2,206,020 | 7/1940 | Berghaus et al. | 204/298.12 |
| 3,799,862 | 3/1974 | Krutenat | 204/298.12 X |
| 4,404,263 | 9/1983 | Hodes et al. | 204/298.12 X |
| 4,415,427 | 11/1983 | Hidler et al. | 204/298.19 X |
| 4,444,635 | 4/1984 | Kobayashi et al. | 204/298.2 X |
| 4,500,408 | 2/1985 | Boys et al. | 204/298.2 X |
| 4,756,810 | 7/1988 | Lamont, Jr. et al. | 204/208.06 X |
| 4,874,497 | 10/1989 | Matsuoka et al. | |
| 4,911,814 | 3/1990 | Matsuoka et al. | |
| 4,915,806 | 4/1990 | Lardon et al. | |
| 4,925,542 | 5/1990 | Kidd. | |
| 4,990,229 | 2/1991 | Campbell et al. | |
| 4,999,096 | 3/1991 | Nihei et al. | 204/298.06 X |
| 5,000,113 | 3/1991 | Wang et al. | 204/298.07 X |
| 5,034,086 | 7/1991 | Sato | 204/298.38 X |
| 5,087,478 | 2/1992 | Williamson. | |
| 5,110,435 | 5/1992 | Haberland. | |
| 5,134,965 | 8/1992 | Tokuda et al. | 204/298.07 X |
| 5,230,784 | 7/1993 | Yoshida | 204/298.19 |
| 5,322,605 | 6/1994 | Yamanishi | 204/298.07 X |

FOREIGN PATENT DOCUMENTS 208419  12/1980  Switzerland.

OTHER PUBLICATIONS

"The National Technology Roadmap for Semiconductors" by the Semiconductor Industry Association (1994).
N. Motegi et al., "Long–Throw Low–Pressure Sputtering Technology for Very Large–Scale Integrated Devices" *Journal of Vacuum Science & Technology B* 13–4:1906–1909 (1995).
"Straightening Out Sputter Deposition" *Semiconductor International* 69, Pieter Burggraaf, Sr. Editor (1995).
Yoshikazu Yoshida (1992), "Low Gas–Pressure Sputtering By Means of Microwave–Enhanced Magnetron Plasma Excited By Electron Cyclotron Resonsance," 61 *Appl. Phys. Lett.* 14:1733–1734.

*Primary Examiner*—Nam Nguyen
*Attorney, Agent, or Firm*—Testa, Hurwitz & Thibeault, LLP

[57] ABSTRACT

A microwave plasma deposition source including a vacuum chamber for containing a substance to be energized in a plasma with microwave energy, a coaxial microwave feed ending in the chamber, a sputter target in the chamber and electrically isolated from the coaxial feed, and a second substrate spaced from the sputter target for defining a plasma volume between the substrates.

14 Claims, 6 Drawing Sheets

MICROWAVE PLASMA DEPOSITION SOURCE AND METHOD OF FILLING HIGH ASPECT-RATIO FEATURES ON A SUBSTRATE

This is a continuation of application Ser. No. 08/204,069 filed on Mar. 1, 1994, now abandoned.

FIELD OF INVENTION

This invention relates to a microwave deposition source that uses a coaxial microwave feed to produce a plasma.

BACKGROUND OF INVENTION

There is currently a great need for improved techniques for depositing high quality films of various materials, over large areas and at high rates, for both microelectronic and non-microelectronic applications. While chemical vapor deposition (CVD) approaches are effective in some simpler material systems, physical vapor deposition (PVD) remains critical in many cases. However, various problems exist with currently available PVD systems, making them impractical for a number of important applications.

Many materials, such as the high Tc superconductors, ferroelectrics, piezoelectrics, and magneto-optic materials, are sensitive to damage by energetic particle bombardment. Work with magnetron guns has achieved a high deposition rate using an energetic ion flux with ion energy over 100 eV. However, damage to the growing film can occur due to, for example, the production of fast neutral species or energetic negative ions, which impact the film. To avoid this problem, there have been attempts to utilize off-axis sputter deposition, which avoids line-of-sight energetic neutrals hitting the substrate. Although high-quality materials can be deposited in such a manner, deposition rates are unacceptably low—in the range of 10 Angstroms (A) per minute. In addition, the fraction of the sputter target which is effectively utilized is very low.

For depositing various sons of materials, it is desirable to achieve a condition in which a substantial fraction of the deposited material is composed of ions of that material, rather than neutrals. For the case where it is desired that a substantial fraction of the material injected into the plasma be ionized, the critical parameter is the plasma density times the pathlength within the plasma. For the case where a sputter target is used to supply the predominate amount of material to the plasma, this value is approximately $2 \times 10^{13}$ cm$^{-2}$–$1 \times 10^{14}$ cm$^{-2}$. For existing sputter processes, nearly all of the material which deposits onto the substrate comes from neutrals. Ions are required for cases in which certain surface features must be covered, an example being the filling of high aspect-ratio features in semiconductor wiring applications with either conductors or insulators. Ions are also required for cases in which the depositing species must bring enough energy to form the desired film type: for example, nanocrystalline diamond and cubic boron nitride.

SUMMARY OF INVENTION

It is therefore an object of this invention to provide a system for depositing high quality films of various materials, at high deposition rate, over large areas, and under a variety of depositing conditions.

It is a further object of this invention to achieve such a system that is commercially useful for depositing high-temperature superconducting films.

It is a further object of this invention to achieve such a system that is commercially useful for depositing high quality metal oxide thin films, such as ferroelectrics and piezoelectrics.

It is a further object of this invention to achieve such a system that is commercially useful for depositing a variety of metals and alloys, under variable conditions.

It is a further object of this invention to achieve such a system that is commercially useful for depositing insulating coatings such as silicon dioxide, diamond, diamond-like carbon, and cubic boron nitride, under variable conditions.

It is a further object of this invention to achieve such a system that is commercially useful for depositing semiconductor materials, such as silicon.

It is a further object of this invention to provide such a system that results, when a sputter target is utilized, in more uniform target erosion, and therefore better use of the sputter target material.

It is a further object of this invention to provide such a system that results in a high deposition rate.

It is a further object of this invention to provide such a system that may employ a sputter target that is easy and inexpensive to manufacture.

It is a further object of this invention to provide such a system that may employ an evaporative source that is simple to integrate into the system.

It is a further object of this invention to provide such a system which allows control over the density and profile of the plasma.

This invention results from the realization that many materials, including various metals, insulators, oxides, and semiconductors, may be deposited as high quality films at a high deposition rate over large areas by using a coaxially-fed ECR microwave generator. The end of the coaxial feed that is in the plasma-producing chamber may be terminated with a sputter target, or, alternatively or in addition, an evaporative or a gas source may be used to add material to the plasma. A bias voltage may be added to the sputter target to allow independent control of ion flux and energy onto the target.

This invention features a microwave plasma deposition source comprising a vacuum chamber for containing a substance to be energized in a plasma with microwave energy, a coaxial microwave feed ending in the chamber, and a first substrate in the chamber at the end of and electrically isolated from the coaxial feed.

Preferably there may also be a second substrate spaced from the first substrate for defining a plasma volume between the two substrates. At least one of the substrates may include a substrate to be processed or a sputter target for providing sputtered material to the plasma volume. There may be means for applying a bias voltage to the first substrate. This may be accomplished with a conductor within the inner conductor of the coaxial microwave feed. There may also be means for applying a bias voltage to the second substrate. In one embodiment, there are further included means for creating electron cyclotron resonance conditions. A vacuum pump may be included for evacuating the chamber to maintain below-atmospheric pressure. There may be means for providing a magnetic field into the chamber for magnetizing the plasma in the chamber.

Preferably there are means for introducing at least one reactant into the chamber. There may also be means for introducing into the chamber the substance to be energized by a plasma. In that case, there may be means for injecting the substance proximate the first substrate. The means for injecting may include means for passing the substance through the substrate, or alternatively, means for flowing the substance radially inward from proximate the substrate edges.

One substrate may be a sputter target and the other a sputter deposition substrate. In that case, there may also be a second sputter target spaced from the first sputter target. The substance may be introduced in a gaseous, liquid and/or solid state. The sputter target may include a number of elements for depositing complex materials. The sputter target may include a number of independently-biased target areas. In that case, one target area may have a different chemistry from another target area to accomplish a desired stoichiometry in the deposited film. The substance may be passed to the substrate through a number of orifices through the substrate. In that case, the means for injecting the substance may include means for controlling the substance pressure to control its flow rate through the orifices.

The second substrate may be in a processing chamber communicating with the vacuum chamber. The vacuum chamber may have an outlet covered with a grid or grid set for accomplishing an ion source. There may further be included a dielectric, microwave-passing window for sealing the vacuum chamber from the atmosphere. In that case, the end of the coaxial feed may be between the first substrate and the window to inhibit sputter deposition on the window. This may be accomplished with an annular window that is between the first substrate and the vacuum chamber. The microwave-passing window may further include means for shielding the window from the sputtered species.

In a more specific embodiment, this invention features a microwave plasma deposition source including a vacuum chamber for containing a substance to be energized into a plasma with microwave energy, a coaxial microwave feed ending in a dark shield in the chamber, a sputter target within the dark shield, and means for applying a bias voltage to the sputter target. Further included in this embodiment are a substrate spaced from the sputter target for receiving sputtered species, and means for applying a bias voltage to the substrate. Finally, this embodiment includes means for introducing into the chamber a substance to be energized to sputter species off the sputter target into the chamber for deposition on the substrate.

DISCLOSURE OF PREFERRED EMBODIMENTS

Other objects, features and advantages will occur to those skilled in the art from the following description of preferred embodiments and the accompanying drawings in which:

This invention may be accomplished in a microwave plasma deposition source that includes a vacuum chamber for containing a substance to be energized in a plasma with microwave energy, a coaxial microwave feed ending in the chamber, and a first substrate in the chamber at the end of the coaxial feed. There is a second substrate spaced from the first substrate for defining a plasma volume between the substrates. At least one of the substrates may be a sputter target for providing sputter material to the plasma volume. A bias voltage may be applied to the sputter target. This is preferably accomplished with a conductor that is within the coaxial microwave feed. Permanent or electromagnets are preferably provided for accomplishing electron cyclotron resonance (ECR) conditions in the plasma volume. This arrangement allows separate control over the ion flux and energy so that the energy of ions impacting the sputter target can be optimized for a given deposition requirement.

Alternatively, or in addition, an evaporant source of material may be used to inject species into the plasma. The evaporant source may be used in place of, or in addition to, the sputter target for deposition applications. In all cases, gaseous reactants may also be fed into the plasma.

The microwave plasma source of this invention is useful in sputtering materials from a target onto a substrate, and in etching and chemical vapor deposition, in which no sputter target is used but the source is used to energize a reactant or reactants that are used to etch a substrate or are deposited on a substrate. This source is also useful as an ion source.

Figure 1:
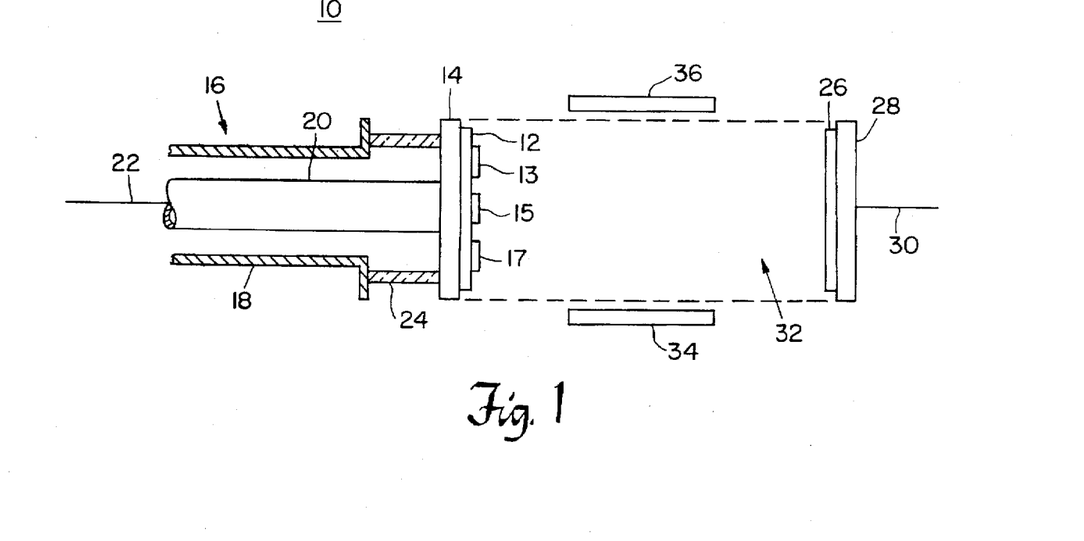
FIG. 1 is a simplified schematic cross sectional diagram of a microwave plasma sputter source according to this invention.

There is shown in FIG. 1 microwave plasma sputter source 10 according to this invention. Sputter source 10 includes sputter target 12 which is a flat, round substrate which may include separate areas 13, 15 and 17 that may be different elements or different compounds than that of target 12 for adjusting the stoichiometry of the film deposited on substrate 26. The volume between substrate 12 and substrate 26 is plasma volume 32. Energy is provided to volume 32 in order to generate a plasma within the volume by microwave coaxial feed 16 including outer conductor 18 and inner conductor 20. Annular dielectric window 24 is placed between conductor 18 and substrate holder 14 for allowing the microwave energy to pass and providing a vacuum seal to allow volume 32 to be held at below-atmospheric pressure. Also shown in this drawing are conductor 22 for providing a bias voltage to substrate 12, and conductor 30 for providing a bias voltage to substrate 26 which is held on substrate holder 28. Also shown in this drawing are alternative or additional sputter sources or evaporative sources 34 and 36 that may be arranged around volume 32 to accomplish desired deposition characteristics.

In use, volume 32 would be provided with argon or another gas that is the plasma source. The plasma would be generated proximate substrate 12 by the microwave energy fed over coaxial feed 16. Window 24 is not in direct line of sight with substrate 12 to inhibit deposition of materials that decreases the useful life of the window. At high pressure (Torr) range the plasma can be sustained without magnetization. At lower pressures (milli Torr or below) a magnetic field would be provided to volume 32. Preferably, the magnetic field has a sufficient strength to establish ECR conditions to allow the establishment of a dense, low voltage (preferably less than 20 eV) microwave plasma directly in front of target 12.

After the microwave plasma is established, a bias, either RF or DC potential, is applied to target 12 through conductor 22. The target potential can be controlled by varying the RF or DC power applied to the target. The ion flux to the target is mainly controlled by the microwave plasma parameters, including microwave power and system pressure. This independent control of ion flux and ion energy allows a high deposition rate on substrate 26 without the production of fast neutrals, found in other sputter sources, that disrupt metal oxides such as superconductors, ferroelectric materials, piezoelectric materials, and magneto-optic materials. This decoupling of the ion flux and ion energy is a feature that is not provided for in diode and magnetron sputtering systems because in those systems the target potential must remain high in order to sustain the plasma. It is this high target potential which effectively creates the fast neutrals that disrupt the deposited films in diode and magnetron sputtering systems.

The sputter source of this invention can operate at pressures even lower than $1 \times 10^{-4}$ Torr with accelerating voltages as low as the sheath voltage (10 to 30 volts). The low pressure limit is determined by the ability to sustain a plasma. The low voltage limit is set by the plasma potential.

Figure 2:
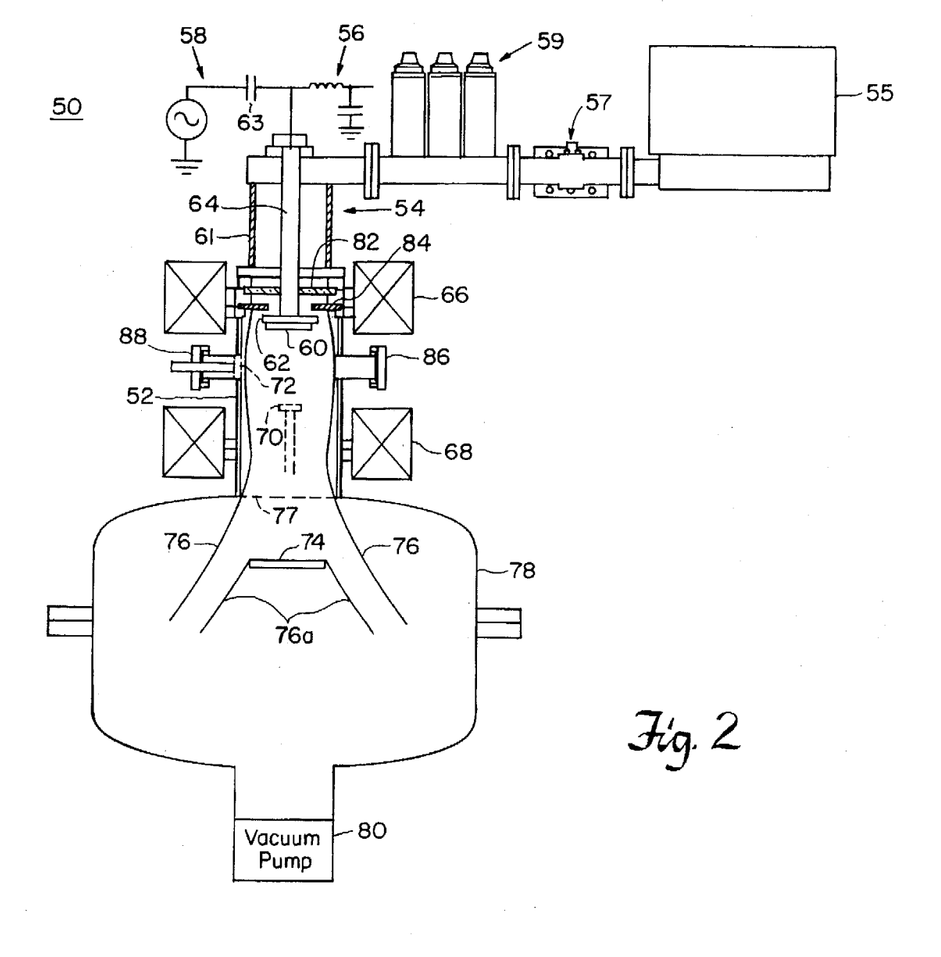
FIG. 2 is a more detailed schematic cross sectional diagram of an alternative embodiment of the microwave plasma sputter source of this invention.

FIG. 2 is a more detailed drawing of a microwave plasma source 50 according to this invention. Source 50 is adapted preferably as a sputter source, but may also be used as a substrate etching system, a CVD system, or an ion source. Source 50 includes coaxial microwave feed 54. Microwave plasma source 50 includes microwave generator 55, three stub tuner 59, and reflected power meter 57 all in a traditional rectangular waveguide which is coupled to circular waveguide 61. Waveguide 61 includes center conductor 64 coaxial therewith which is extended into vacuum chamber 52 in which the plasma is formed. This arrangement accomplishes a coaxial microwave feed ending in target holder 62 which is within chamber 52. Target 60 is on the side of holder 62 away from center conductor 64 so that the microwave power is provided around target 60 and converges towards the longitudinal axis of chamber 52 to initiate a plasma proximate the exposed face of substrate 60. Electromagnets 66 and 68 are provided for establishing an 875 G magnetic field in chamber 52 required for ECR. This field also shapes the plasma downstream as it exits chamber 52 and is provided to deposition chamber 78 in which deposition substrate 74 is found. The approximate boundaries of the plasma are indicated by boundary lines 76 and 76a.

Dielectric window 82 allows a vacuum to be drawn in chamber 52. Sputter shield 84, for example an annular metal plate, may be provided between target 60 and window 82 to further inhibit deposition of sputtered species on window 82 to extend its life. An RF or DC bias is provided by bias circuit 58 to substrate 60 over conductor 63 that is within coaxial center conductor 64.

In one embodiment, source 50 may include an 11" diameter stainless steel vacuum chamber 52 with access ports 88 and 86. FIG. 2 also illustrates alternate sample or target locations 70 and 72. These can allow the position of the substrate relative to the plasma or sputter target to be varied, changing the composition and microstructure of the deposited material. It also allows the injection of evaporated material into the plasma, when desired. The system may be evacuated with a 380 L per second turbo molecular pump 80 backed by a 27 CFM dry pump. The base system pressure is typically less than $3 \times 10^{-7}$ Torr. Argon and oxygen may then be introduced into a gas injection ring, not shown, around sputter source 60 through separate mass flow controllers. The gasses can be introduced separately or can be accurately mixed for reactive sputtering.

Figure 3:
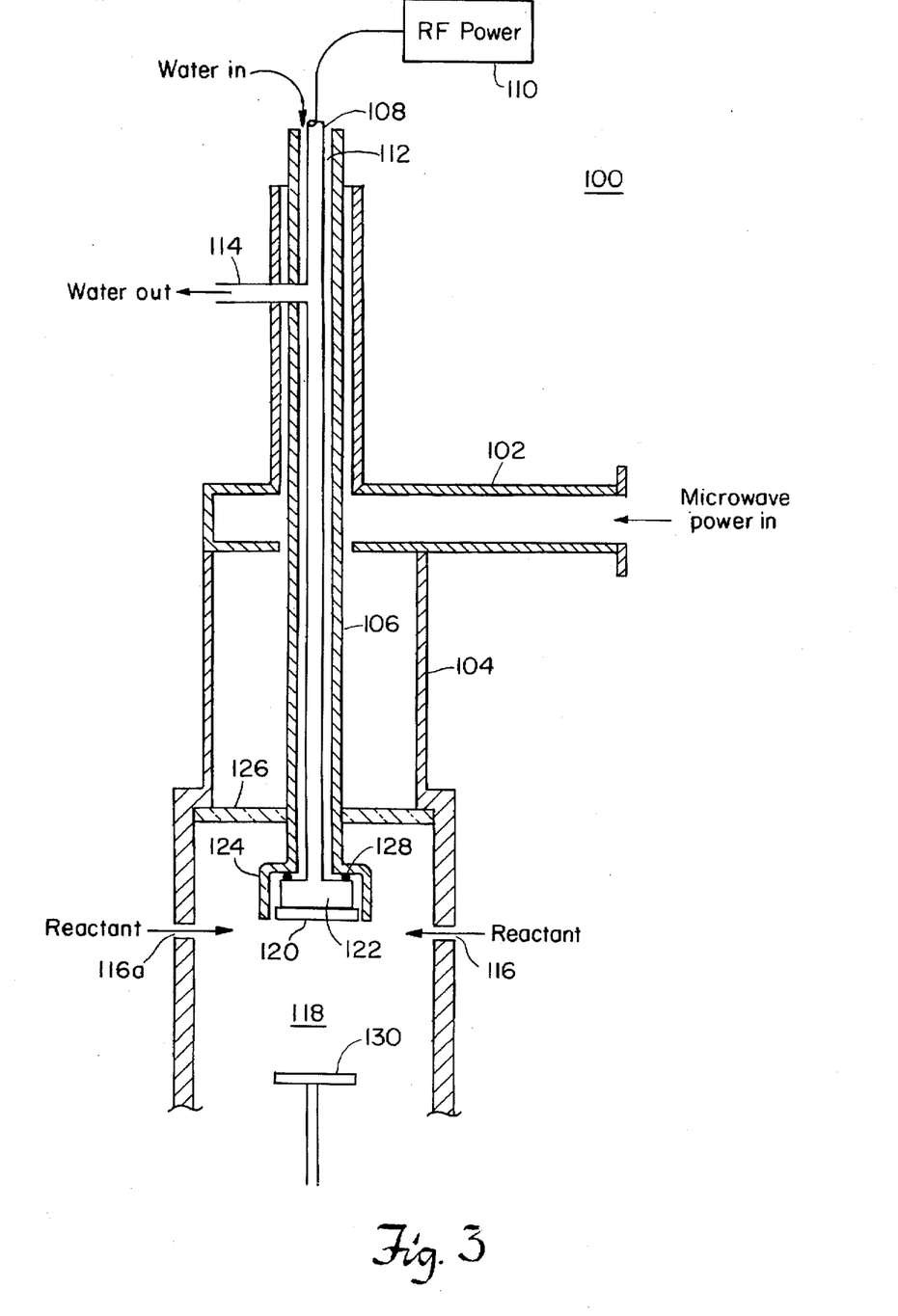
FIG. 3 is a slightly more detailed cross sectional view of a portion of the sputter source of FIG. 2.

A more detailed drawing of a sputter source useful in this invention is shown in FIG. 3. Sputter source 100 includes sputter target 120 that is mounted with a conductive epoxy to copper block 122 that is itself mounted within dark space shield 124 at the end of microwave coaxial center conductor 106. O-ring 128 provides a gas and water tight seal to maintain the vacuum in chamber 118 and also to allow for substrate cooling water feed to allow operation at high power. Center conductor 106 is preferably an aluminum tube. Stainless steel tube 108 fits down the center of tube 106 and screws into copper block 122. A spring-loaded nut assembly, not shown, on the outer end of tube 108 holds the tubes 106 and 108 together and also urges block 122 against opening 128 to maintain the liquid and gas seal. Tube 108 also serves as the conductor for RF power provided by power source 110. Cooling water is flowed in channel 112 between tube 108 and 106 and returns through the center of the stainless steel tube 108 to an outlet port 114.

RF power from a 300 watt 13.56 MHz RF generator is applied through a capacitive tuning network to the central stainless steel tube 108. The tuning network includes a low pass filter and voltage divider for sensing the RF induced DC potential on the target. Low loss coaxial cables are used for conducting the matching network to sputtering source 120.

Microwave power at 2.45 GHz is provided by an Applied Science and Technology S1000 microwave power generator.

The microwaves are launched into a resonance zone located near the surface of target 120. A gas (called a reactant in the drawing) is provided through orifices 116 and 116a, which are preferably accomplished in a ring disposed around the outer edge of target 120 to provide the gas which is energized into a plasma by the microwave energy. An external electromagnet, not shown in this drawing, sets up the 875 Gauss magnetic field required for electron cyclotron resonance. This creates a dense, low voltage (less than 20 eV) microwave plasma directly in front of target 120. After the microwave plasma is established, the RF potential is applied to sputter target 120 through power source 110 as described above. The target potential is controlled by varying the RF power applied to the target. The ion flux to the target is mainly controlled by the microwave plasma parameters, including microwave power and system pressure. This provides independent control of ion flux and ion energy that allows the system to deposit sensitive metal oxide films on substrate 130 that would otherwise be disrupted by the fast neutrals created in diode and magnetron sputtering systems.

Figure 4A:
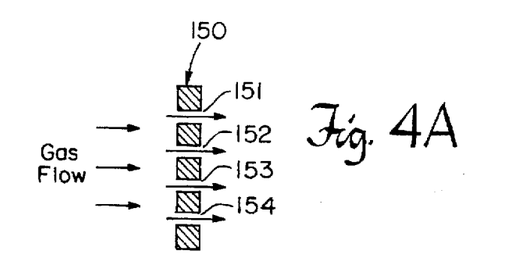
FIG. 4A is a simplified cross sectional diagram of an alternative form of sputter target useful in the sputter source of this invention.
Figure 4B:
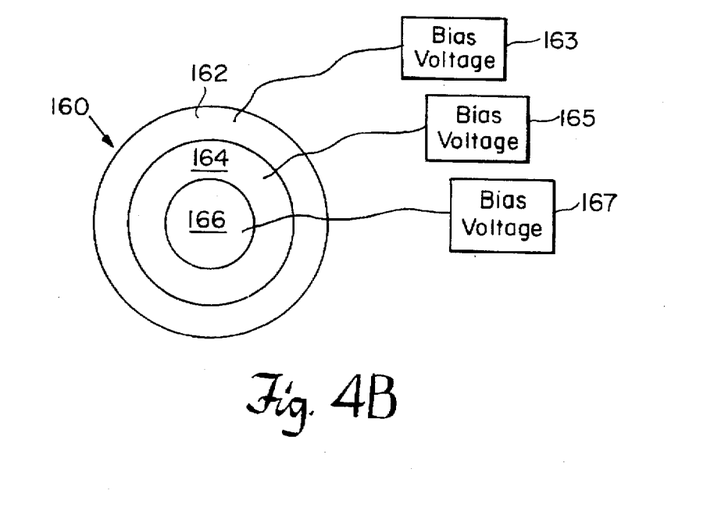
FIG. 4B is a front view of another alternative target design for the sputter source of this invention.

The reactant source or sources can be gasses, liquids, and/or solids. The reactants may be provided radially around the electrode or through the electrode as shown in FIG. 4A, in which target 150 includes apertures 151 though 154 through which the reactive gas is flowed. The flow rate can then be controlled by altering the gas pressure and/or aperture size. Plasma profile can be controlled by aperture arrangement. In another alternative sputter source arrangement, source 160, FIG. 4B, includes separate source areas 162, 164 and 166 to accomplish a disc source. Each of the areas can have a different stoichiometry to accomplish a desired sputter deposition characteristic. Further, each area may be independently biased as shown by bias voltage sources 163, 165 and 167 for areas 162, 164 and 166, respectively.

This invention contemplates a microwave plasma source that can be used for sputtering, CVD, etching, or as an ion source by use of grid or grid set 77, FIG. 2. The use of grid or grid set 77 allows the ion energy to be varied, without applying electrical bias to the substrate itself. The system includes at least two substrates at the positions of substrates 12 and 26, FIG. 1. Alternate substrate locations are locations 34 and 36. Any of these three may be the target or the substrate on which the sputter species are deposited. For sputter applications, the plasma-source gas may be reactive or non-reactive as desired. Additionally, once the plasma is initiated and the sputtering begins, the sputtered species themselves may maintain the plasma. An evaporative source may also be used to feed material into the plasma.

The coaxial feed 16 can support different frequencies, unlike the traditional rectangular microwave feed. Additionally, the coaxial feed can support multiple frequencies simultaneously to accomplish a desired energization objective.

As described above, the plasma can be magnetized or not as desired. The magnetization can create ECR conditions or not as desired. The magnetic field could be axial, collimated, flaring or cusp. The field could be created by permanent or electromagnets. The system may be operated at a range of pressures exceeding $10^{-4}$ to 1 Torr.

The microwave plasma source of this invention may be used for a variety of deposition and processing applications. Among those applications include the deposition of diamond, diamond-like carbon, cubic boron nitride, metals and metal alloys, simple oxides, complex oxides such as ferroelectrics or high $T_c$ superconductors, conducting oxides, and semiconductors.

Diamond-like carbon is a hard wear coating but does not have the optical characteristics of diamond. Films would be deposited by sputtering a carbon target. It may not be necessary to ionize a substantial fraction of the sputter material. An appropriate electrical bias and substrate temperature can be maintained.

Cubic boron nitride is sputtered in a similar fashion using a boron nitride target. Nitrogen may be added to the chamber to achieve the proper stoichiometry of the deposited film.

Metals and metal alloys can be applied by sputtering with an appropriate target. In some cases it may be preferable to use the multiple sputter target concept so that the voltage on each target, and hence the amount of material sputtered from it, can be independently controlled. The plasma can be configured such that the flux of material hitting the substrate can be varied from mostly neutral material to mostly ions. This is accomplished by adjusting the magnetic field profile, microwave launch structure, and microwave power to set the plasma density profile. For a dense, long plasma, the likelihood of ionization is increased relative to a less dense, shorter plasma column. Reactive gasses can be employed where desired to allow materials such as titanium nitride, TiN, or tantalum oxide, $Ta_2O_5$, to be deposited. The source of metal atoms may be from an evaporant source, in addition to or in place of the sputter source.

For the deposition of oxides, simple oxides such as silicon dioxide can be deposited by choosing a target material of silicon or silicon dioxide and sputtering it. Some oxygen gas may be required in the system to adjust the stoichiometry of the deposited film to the correct value. The degree of ionization of the deposited material can be varied through adjusting the plasma properties. This system allows the deposition of silicon dioxide without the use of hydrogen in the system, which can negatively affect the film properties. This technique may allow true room-temperature deposition of high quality silicon dioxide.

More complex oxides, such as ferroelectrics or superconductors, can be deposited using targets of appropriate materials, with other elements added to make up material deficits. For example, oxygen gas may be added to make up an oxygen deficit. Alternatively, multiple sputter targets may be used. To prevent energetic bombardment of the deposited film, the sputter target may be operated at low voltages.

Conducting oxides are deposited by sputtering the appropriate target material or reactively sputtering the metal. An example of this is the ease of titanium nitride, which can be deposited through either sputtering a target composed of titanium nitride, or by sputtering a target composed of titanium, in a nitrogen ambient. Amorphous or polycrystalline silicon may be deposited by sputtering with a simple silicon target. The nature of the deposited film is controllable through varying the degree of ionization of the depositing species, the energy of the depositing species, and the temperature of the substrate. This process may also be useful for epitaxially depositing silicon.

Aluminum oxide may be deposited by using a target of the appropriate material, with oxygen added as necessary to make up any material deficit. Alternatively, aluminum may be evaporated in the presence of oxygen.

Figure 5:
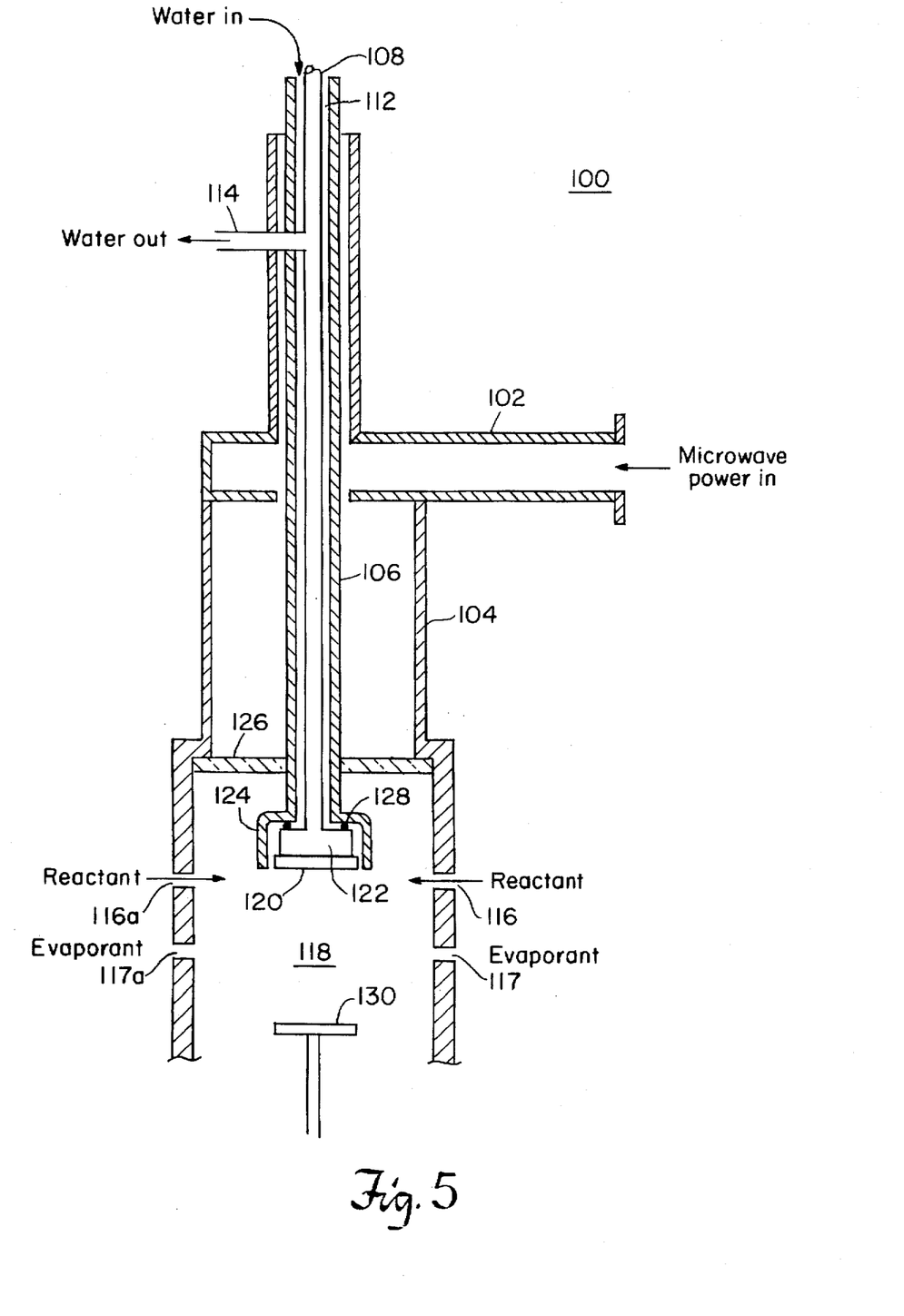
FIG. 5 is a schematic cross-sectional diagram of an embodiment consisting of an evaporative source in combination with coaxial microwave plasma source.
Figure 6:
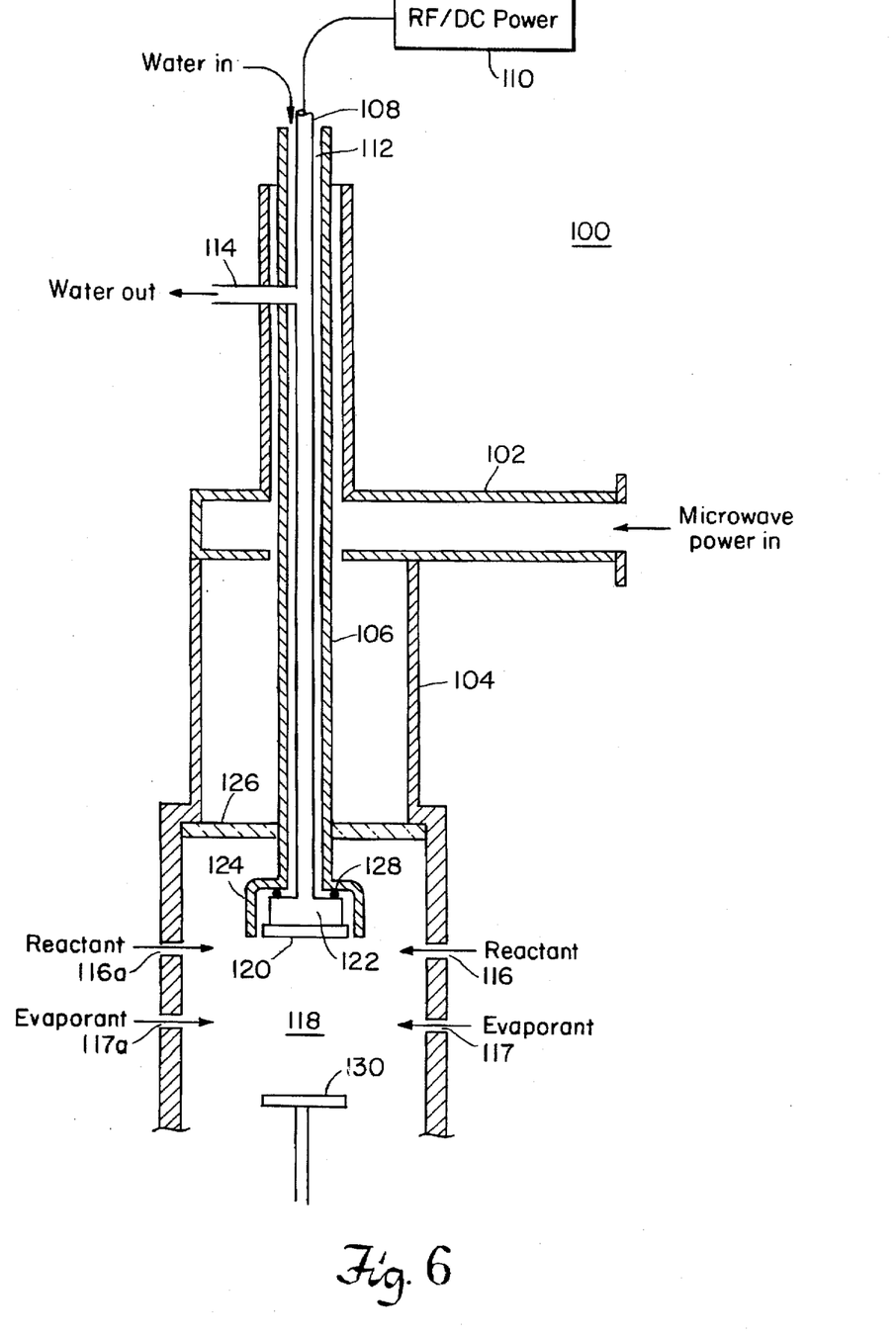
FIG. 6 is a schematic cross-sectional diagram of an embodiment consisting of an evaporative source in combination with a coaxial microwave plasma sputter source.

Instead of or in addition to a sputter source, deposition could also be accomplished by evaporation and then ionizing the evaporant. For this purpose evaporant ports 117 and 117a may be provided as shown in FIGS. 5 and 6. FIG. 5 uses a coaxial microwave plasma source. FIG. 6, in contrast, uses a coaxial microwave plasma sputter source and requires RF/DC power 110.

Figure 7:
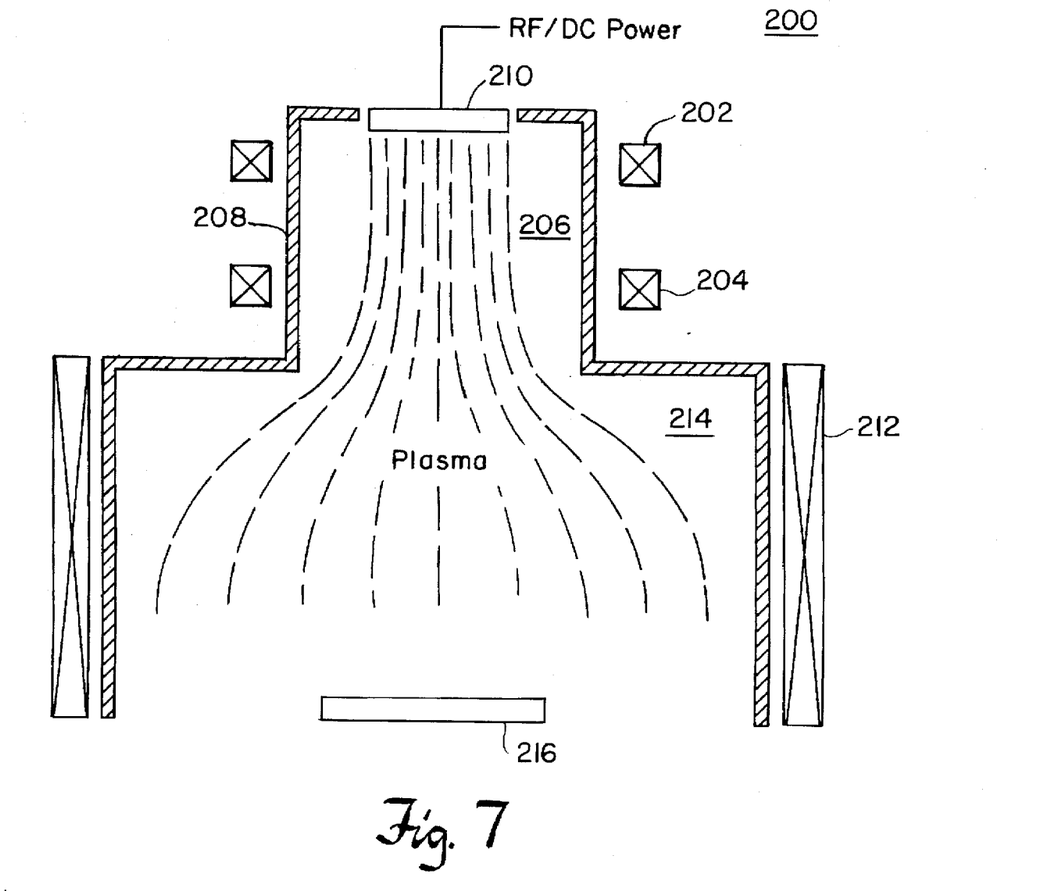
FIG. 7 is a schematic cross-sectional diagram of a microwave plasma sputter source for increasing plasma density proximate the sputter target and decreasing plasma density proximate the substrate.

It is necessary to have a high density plasma in the region of the sputter target in order to facilitate the ionization of a large fraction of the sputtered material. In order to reduce the plasma density in the region of the wafer to a more desirable level and to enhance the uniformity of the plasma in the vicinity of the wafer, a multipole confinement array may be used around the vacuum vessel in conjunction with the sputter source as shown by sputter source 200, FIG. 7. Sputter source 200 includes electromagnets or permanent magnets 202, 204 in the region 206 of the chamber 208 near sputter target 210 to provide a high density plasma and uses a multiple array of magnets 212 surrounding an expanded volume 214 of chamber 208 to cause the plasma to become more diffuse in the vicinity of substrate 216.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. A microwave plasma deposition source, comprising:

a vacuum chamber for containing a substance to be energized in a plasma with microwave energy;

a coaxial microwave feed having an inner conductor and a dielectric window shielded from the plasma for passing microwave radiation substantially unimpeded ending in the chamber;

a target positioned in the chamber at the end of the coaxial feed;

a substrate positioned in the chamber and spaced from the target for receiving target material; and a first magnet positioned between the target and the substrate and having a magnetic field extending a volume between the target and the substrate for magnetizing a dense plasma throughout the volume between the target and the substrate, thereby increasing the probability of ionizing material sputtered from the target and traversing the plasma volume.

2. The microwave plasma deposition source of claim 1 further comprising a target bias voltage source electrically coupled to the target through the inner conductor for controlling the energy of gas ions impacting the target.

3. The microwave plasma deposition source of claim 1 further comprising a substrate bias voltage source electrically coupled to the substrate for controlling the energy of ionized materials impacting the substrate.

4. The microwave plasma deposition source of claim 1 wherein the first magnet creates an electron cyclotron resonance condition between the target and the substrate within the chamber, wherein the electron cyclotron resonance condition is displaced from the target.

5. The microwave plasma deposition source of claim 1 further comprising an injector for injecting a substance proximate the target.

6. The microwave plasma deposition source of claim 1 further comprising a second magnet positioned between the target and the substrate and spaced apart from the first magnet for controlling the ion flux traversing from the target to the substrate.

7. The microwave plasma deposition source of claim 1 further comprising a second target spaced from the first target.

8. The microwave plasma deposition source of claim 1 wherein the target includes a plurality of elements for depositing complex materials.

9. The microwave plasma deposition source of claim 1 wherein the target includes a plurality of independently-biased target areas and the inner conductor includes a plurality of electrically isolated conductors which are electrically connected to the independently-based target areas.

10. The microwave plasma deposition source of claim 1 further comprising a processing chamber communicating with the vacuum chamber wherein the substrate is positioned in the process chamber.

11. The microwave plasma deposition source of claim 1 wherein the end of the coaxial feed is positioned between the target and the window to inhibit sputter deposition on the window.

12. The microwave plasma deposition source of claim 1 wherein the window is annular and is positioned between the target and the vacuum chamber.

13. A method of filling high aspect-ratio features on a substrate with a microwave plasma deposition source, comprising:

containing in a vacuum chamber a substance to be energized in a plasma with microwave energy;

feeding a microwave signal into the chamber with a coaxial microwave feed having a microwave passing window shielded from the plasma;

providing a target in the chamber positioned at an end of the coaxial feed and electrically connected to an inner conductor of the coaxial feed;

separating a substrate containing high aspect-ratio features from the target in the chamber;

biasing the target by energizing the inner conductor;

forming a dense plasma throughout a volume extending between the target and the substrate by magnetizing a magnet positioned between the target and the substrate, thereby creating a high fraction of ionized target material; and filling the high-aspect ratio features with the ionized target material.

14. The method of claim 13 wherein the microwave signal comprises multiple frequencies.

* * * * *